(12) United States Patent
Keita et al.

(10) Patent No.: US 8,314,413 B2
(45) Date of Patent: Nov. 20, 2012

(54) OPTOELECTRONIC DEVICE WITH A BUILT-IN FUSE MECHANISM

(75) Inventors: Mamadi Keita, Basel (CH); Antoine Simon, St. Louis (FR)

(73) Assignee: Endress + Hauser Flowtec AG, Reinach (CH)

( * ) Notice: Subject to any disclaimer, the term of this patent is extended or adjusted under 35 U.S.C. 154(b) by 586 days.

(21) Appl. No.: 12/461,884

(22) Filed: Aug. 27, 2009

(65) Prior Publication Data

US 2010/0086312 A1    Apr. 8, 2010

(30) Foreign Application Priority Data

Sep. 1, 2008    (DE) .......................... 10 2008 045 139

(51) Int. Cl.
*H04B 10/00*    (2006.01)
(52) U.S. Cl. ........................................ 250/551; 250/239
(58) Field of Classification Search .................. 250/551, 250/239
See application file for complete search history.

(56) References Cited

U.S. PATENT DOCUMENTS

| | | | |
|---|---|---|---|
| 4,730,115 A * | 3/1988 | Abe ............................... | 250/551 |
| 4,924,343 A | 5/1990 | Niemi | |
| 5,990,475 A * | 11/1999 | Alegi ............................ | 250/239 |
| 6,522,514 B1 | 2/2003 | Torazawa | |
| 2006/0242350 A1 | 10/2006 | Worley | |

FOREIGN PATENT DOCUMENTS

| | | |
|---|---|---|
| DE | 3330465 A1 | 8/1983 |
| DE | 3707239 A1 | 3/1987 |
| DE | 37 37 445 | 5/1989 |
| DE | 20105050 U1 | 3/2001 |
| DE | 102006062599 A1 | 12/2006 |
| EP | 1885053 A2 | 6/2008 |
| JP | 60-211252 | 10/1985 |
| WO | 2004/006404 A2 | 1/2004 |

OTHER PUBLICATIONS

Woertz AG: "Optocoupler Modules" Internet Citation, Sep. 1, 2002, XP007910732.

* cited by examiner

*Primary Examiner* — Seung C Sohn
(74) *Attorney, Agent, or Firm* — Bacon & Thomas, PLLC

(57) ABSTRACT

An optoelectronic device for transmission of an electrical signal of an input electrical current circuit to an output electrical current circuit galvanically isolated from the input electrical current circuit. The device includes a housing. The input electrical current circuit contains, for producing an optical signal, an optical transmitting unit, which is arranged in the housing. The output electrical current circuit contains, for receiving the optical signal, an optical receiving unit, which is arranged in the housing. At least one fuse mechanism is provided in the housing, which interrupts transmission of the electrical signal in the case of an electrical current flow, which lies above a predetermined electrical current level.

9 Claims, 2 Drawing Sheets

OPTOELECTRONIC DEVICE WITH A BUILT-IN FUSE MECHANISM

TECHNICAL FIELD

The invention relates to an optoelectronic device for transmission of an electrical signal from an input electrical current circuit to an output electrical current circuit galvanically isolated from the input electrical current circuit. Additionally, the invention relates to a measuring device of process automation technology for determining and/or monitoring a chemical and/or physical, measured variable.

BACKGROUND DISCUSSION

The device includes a housing. The input electrical current circuit contains an optical transmitting unit for producing an optical signal. The optical transmitting unit is arranged in the housing. The output electrical current circuit has an optical receiving unit for receiving the optical signal. The optical receiving unit is arranged in the housing.

The input, and/or output, current circuit(s) are/is contactable via a wire connection.

Optoelectronic devices with an optical transmitting unit and an optical receiving unit are used, for example, for digital and/or analog signal transmission between two electrical current circuits galvanically isolated from one another.

In industrial measurements technology, especially in automation and process control technology, such optoelectronic devices are applied and required in field devices for galvanic isolation of the electrical current circuits for explosion protection. The corresponding field devices ascertain, for example, pressure, flow, fill level, dielectric constant, interface level, temperature or a some other physical and/or chemical, process variable as a process variable in the course of a process. Available from Endress+Hauser are, for example, field devices under the marks, Cerabar, Deltabar, Deltapilot, Promass, Levelflex, Micropilot, Prosonic, Soliphant, Liquiphant, and Easytemp, which serve primarily to determine and/or to monitor at least one of the above referenced process variables of a medium.

Galvanic isolation is applied both in the case of so-called two conductor devices, which transmit the supply energy and the measurement signal via a common line-pair, as well as also in the case of four conductor devices, which have, in each case, a separate line-pair for transmission of the measurement signal and the supply energy. Examples of such field devices with such a device formed as an optocoupler for galvanically isolated electrical current circuits are described in U.S. Pat. No. 4,654,771 A and WO 2004/048905 A1.

Optoelectronic devices used mainly as optocouplers are described, for example, in DE 199 20 403 A1 and U.S. Pat. No. 6,947,620 B2. In general, such optoelectronic devices are composed of at least one transmitting element, e.g. a light-emitting diode, and at least one receiving element, e.g. a photodiode or a phototransistor, with the transmitting element and the receiving element being spatially and galvanically isolated from one another at least via a light conducting element.

In order that such optoelectronic devices used for signal transmission satisfy the explosion protection required in industrial measurements and automation technology, they must also maintain the minimum values required for minimum separations between galvanically isolated, electrical current carrying components as regards air paths, insulation thicknesses and electrical current creep paths. The Ex-i standard IEC60079-11 requires, for example, at a voltage of 375 V a minimal creep path length of 10 mm or a minimum distance of 2 mm under potting compound, or a minimum distance of 1 mm under solid insulation. These distances refer, in such case, in particular, to the minimum distances between the operationally electric current carrying connections and conductive traces of the electrical current circuits coupled by means of such optoelectronic devices. Furthermore, there such optocouplers must also fulfill increased requirements as regards temperature resistance and explosion endangerment risk, as well as also as regards the damages arising in the case of occurring overloads.

In order, in spite of the high safety requirements, to enable a highest possible coupling factor (CTR, current transfer ratio), as well as an, as much as possible, compact form of construction of such optoelectronic devices, their light conducting elements are embodied corresponding to the requirements of explosion protection and signal transmission.

The solutions known from the state of the art weaken either the transferred light signal, since the optical components are e.g. spaced farther from one another, or an additional electrical, or electronic, circuit is necessary, which limits the electrical current flow in the optoelectronic device to the maximum allowable electrical current level, as determined, for example, by a safety certificate. These solutions have, however, an increased space requirement and require the application of additional electrical or electronic components onto the electronics board. If one desires to omit these additional components, then no maximum permissible electrical current level, as given, for example, in a data sheet or in the safety certificate, may be exceeded. In this case, it must, however, be taken into consideration, that the optoelectronic device, in the case of malfunction, can be overloaded with theoretically unlimited electrical current. This overload can, naturally, damage the optoelectronic device. Following the overload, however, a minimum degree of insulation corresponding to an Ex-i standard must remain.

In the case of today's usual semiconductor components in housings with hardened potting compound, an extreme overloading leads, in general, to an explosive-like bursting of the housing and therewith to a wire connection/electrical circuit interruption. Such an uncontrolled bursting of the housing can lead to damaging consequences, not only for the measuring device, but also for the environment of the measuring device.

Known from patent documents EP0434489, U.S. Pat. Nos. 4,107,762, 4,814,946, 6,411,498 are capacitors with embedded, melting fuses, in order, in the case of a defect, for example, in the case of a short circuit between the electrodes of the capacitor, to interrupt the electrical current flow.

Electrical components such as capacitors are, however, not, or only insufficiently, suited for transmission of signals, especially in the case of galvanic isolation, since they are frequency dependent. Additionally, capacitors provide no high degree of insulation between the electrical current circuits, which are to be electrically isolated.

SUMMARY OF THE INVENTION

An object of the invention is to provide an explosion resistant, optoelectronic device with defined fuse characteristic.

The invention is achieved by an optoelectronic device with a housing, an optoelectronic device with a wire connection, and by use of an optoelectronic device in a measuring device of process automation technology.

The object is achieved according to the invention as regards the optoelectronic device with a housing by the features that at least one fuse mechanism is provided in the housing for interrupting transmission of the electrical signal in the case of an electrical current flow lying above a predetermined electrical current level.

Preferably, the fuse mechanism is so designed, in such case, that it activates in the case of an electrical current level, which lies below the electrical current level, in the case of which danger is present, that either the optical transmitting unit or the optical receiving unit will explode. An explosion cannot necessarily be prevented. According to the invention, the thereby occurring damage is limited by the feature that transmitting unit and receiving unit are not simultaneously without protection by housing plastic. Of advantage in the case of application of a fuse mechanism integrated into the optoelectrical device is that a fuse mechanism accumulates less energy than an optical receiving or transmitting unit composed, for example, of a semiconductor material, or a semiconductor circuit. From the fact that a smaller energy amount is needed for activating the fuse mechanism in comparison to the energy amount, which can be stored in the optical transmitting or receiving unit, there is also a smaller explosive, bursting force in the case of an overloading. According to the invention, thus, in simple manner, and without other external components, an optoelectronic device meeting the standards for explosion safety can be implemented. The predetermined electrical current level lies, in such case, below the electrical current level leading to an explosion, preferably under the value leading to a damaging of the optical transmitting unit or the optical receiving unit.

In an advantageous further development, the fuse mechanism interrupts the input electrical current circuit or the output electrical current circuit in the case of an electrical current flow, which lies above a predetermined electrical current level. Preferably, the fuse mechanism interrupts the input or output electrical current circuit before an explosion of the optical transmitting or receiving unit as a result the overload. Of advantage is the especially cost effective as well as space saving implementability, for example, in the form of a melting fuse or a switch, which interrupts the input and/or output electrical current circuit and therewith ends the signal transmission from the optical transmitting unit to the optical receiving unit. Advantageously, the fuse mechanism, for example, interrupts only the part of the input or output electrical current circuit, which contains the optical transmitting unit, or the optical receiving unit.

In an advantageous embodiment, the fuse mechanism is an electrical, electronic or thermal fuse mechanism. These fuses or circuit breakers are already commercially usual and, consequently, cost effectively obtainable.

In an additional advantageous embodiment, the optical transmitting unit, the optical receiving unit and/or the fuse mechanism are at least partially embedded in a potting compound. In order to meet the requirements of the standards for explosion protection, a suitable material and a suitable coating thickness of the potting compound are selected. The additional embedding of the components provides an insulating coating. In this way, the components are electrically insulated and sufficiently protected under operational conditions.

In a form of embodiment of the invention, the housing is composed at least partially of the potting compound. The housing, in which the components are arranged, can be composed especially completely of the potting compound. Of advantage is the compact construction of the optoelectronic device resulting from the proposed form of embodiment, and the materials, as well as space, savings resulting therefrom.

In a preferred form of embodiment, the fuse mechanism is so designed and matched to the housing and/or the potting compound, that, in the case of a possible damage of the housing and/or the potting compound caused by the activating of the fuse mechanism, the optical transmitting unit or the optical receiving unit is nevertheless at least partially still surrounded by the housing and/or embedded in the potting compound. Through a suitable coordination of the fuse mechanism to the housing or the potting compound, damage caused by an overload and the activating of the fuse mechanism can be avoided or at least reduced.

In an advantageous form of embodiment, the housing is, in such case, divided into different housing sections, which, for example, contain the transmitting unit and/or the receiving unit or the fuse mechanism. These housing sections can, for example, be connected with one another by means of points of weakness.

Safety relevant damaging of the optoelectronic device can, for example, arise through destructive mechanical effects as a result of an overload. Due to the overload, explosions can occur, especially in the region, in which the fuse mechanism is arranged, and these explosions can propel parts of the housing and/or the potting compound outwardly. Especially the housing and the covering of potting compound on the optical transmitting or receiving unit can, in such case, break away.

Since the reaction of the fuse mechanism is matched suitably to the material and the coating thickness of the housing and/or the potting compound, these damages can be reduced and the optoelectronic device can be embodied explosion safely corresponding to an Ex standard.

In an additional form of embodiment, the fuse mechanism has a distance from the optical transmitting unit and/or from the optical receiving unit, such that, in the case of a possible damage to the housing or the potting compound caused by the activating of the fuse mechanism, the optical transmitting unit or the optical receiving unit nevertheless remains at least partially surrounded by the housing and/or embedded in the potting compound. An advantage of the proposed form of embodiment is that the operationally electrical current carrying and electrical current storing, optical transmitting and receiving units installed in the housing are not simultaneously, or not completely, without insulating covering, and the optoelectronic device maintains its insulating action even in the case of a defect. Preferably, the fuse mechanism is not integrated into the optical transmitting unit or receiving unit and not directly connected, but, instead, connected at least via electrical connecting lines with the optical transmitting or receiving unit. In this way the destructive effects of an overload, such as, for example, an explosion of the fuse mechanism, act not primarily in the housing section, in which the transmitting and/or receiving unit(s) are/is arranged.

Preferably, the fuse mechanism is arranged in a housing section remote from the optical transmitting or receiving unit. The particular distance between the fuse mechanism and the optical transmitting or receiving unit is, in such case, a matter of design and depends on the materials used and the arrangement of the components.

In an advantageous form of embodiment, there are at least two electrical terminals on the housing for establishing a first electrical connection with the input electrical current circuit and at least two other electrical terminals on the housing for establishing a second electrical connection with the output electrical current circuit. Via the provided connections, the optoelectronic device is contactable while arranged in the housing.

In an additional embodiment, the input electrical current circuit contains at least a first fuse mechanism, which is arranged in the housing, and the output electrical current circuit contains at least a second fuse mechanism, which is arranged in the housing. In this way, the optoelectronic device can be used, for example, as an optocoupler and be embodied cost effectively and safely corresponding to the requirements of EN 50020:2002 IEC 60079-11, FM Class 3610:1999 and/or CSA No. 157-92.

In a further development, the first fuse mechanism is arranged in series with the optical transmitting unit and/or the second fuse mechanism is arranged in series with the optical receiving unit. In this way, the transmission of the electrical signal of the input electrical current circuit to the output electrical current circuit is specifically interrupted, without that other components of the electrical current supply arranged, for example, parallel to the optical transmitting or receiving unit are cut off.

In a further development, the first fuse mechanism has a distance to the second fuse mechanism, which is larger than the distance of the optical transmitting unit from the optical receiving unit. In the case of bare wires, connecting lines or other electrical current carrying or electrical current storing elements in the region of the first or second fuse mechanism as a result of an explosion of the first or second fuse mechanism, the jumping of sparks through the, in comparison to the distance between the optical transmitting unit and the optical receiving unit, greater distance of the first fuse mechanism from the second fuse mechanism is prevented.

As regards the optoelectronic device with wire connection, the object of the invention is achieved by the feature that the wire connection is embodied as a fuse mechanism, wherein the wire connection is so dimensioned, that it interrupts the transmission of the electrical signal in the case of an electrical current flow lying above a predetermined electrical current level. In this way, the optoelectronic device is protected, for example, in the face of an electrical current flow lying above a predetermined electrical current level arising in the case of an overload. The fuse mechanism is, in such case, provided by the wire connection, via which the optoelectronic device is electrically connected, for example, to a support element. The fuse mechanism existing on the basis of the wire connection is composed, in such case, of a suitable wire material, for example, aluminum, and a suitably selected wire gage.

As regards the measuring device, the object of the invention is achieved by the feature that a measuring device is used having an optoelectronic device according to at least one of the aforementioned forms of embodiment. The optoelectronic device of the invention fulfills the requirements placed on a measuring device as regards explosion safety in a high measure and enables, through the saving of external components, a cost effective and, at the same time, space saving arrangement of a measuring, and operating, electronics in the measuring device.

BRIEF DESCRIPTION OF THE DRAWINGS

The invention will now be explained in greater detail on the basis of the appended drawing, the figures of which show as follows.

DETAILED DISCUSSION IN CONJUNCTION WITH THE DRAWINGS

Figure 1:
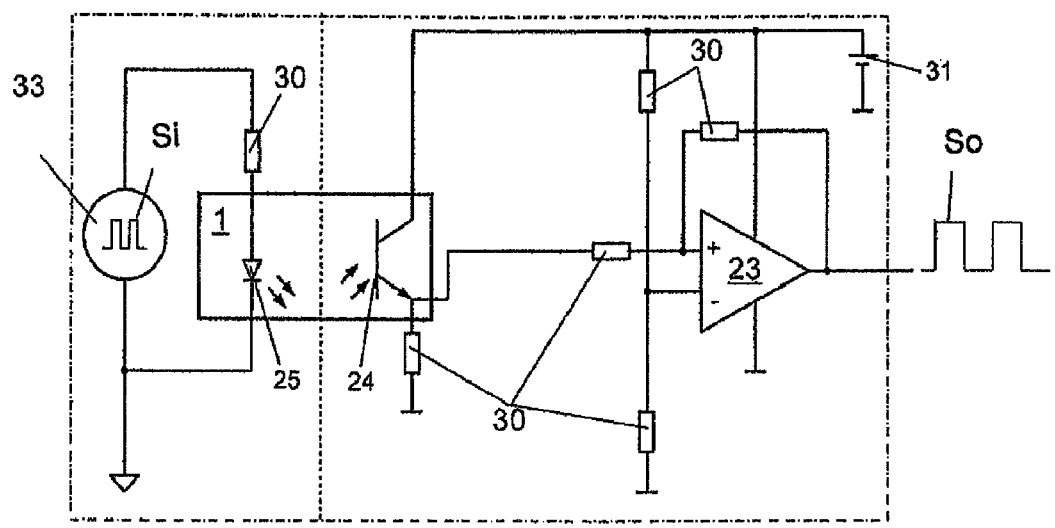
FIG. 1 is an example of the application of an optocoupler known from the state of the art.

FIG. 1 shows an example of application of an optoelectronic device 1. The device serves, in such case, as an optocoupler for transmission of an alternating voltage signal Si. The illustrated optocoupler is already known from the state of the art, for example, from patent application DE 102006062599 A1. Connected to the input electrical current circuit 3 is a signal generator 33, which, limited via a resistor 30, feeds a light-emitting diode 25 as transmitting unit 4. The light-emitting diode 25 sends, in accordance with the signal Si of the signal generator, a light signal to the receiving unit 6 in the output electrical current circuit 5. Connected to the output electrical current circuit 5 is a phototransistor 24 as receiving unit 6, whose output signal So is amplified by a non-inverting, operational amplifier circuit. The non-inverting, operational amplifier circuit is composed of an operational amplifier 23 and a plurality of resistors 30 for adjusting the amplification.

Figure 2:
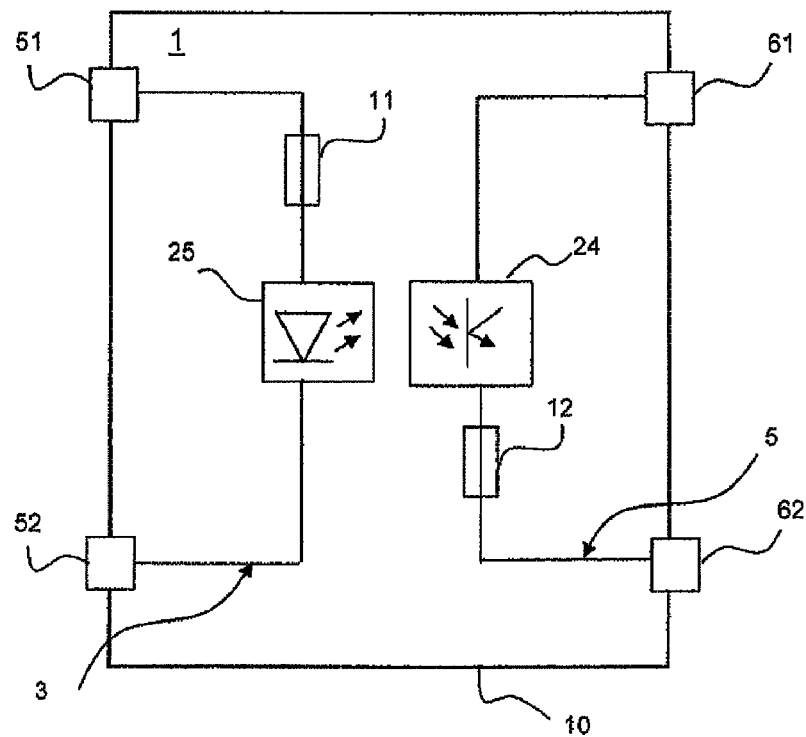
FIG. 2 is a schematic drawing of a first form of embodiment of an optoelectronic device of the invention.

FIG. 2 shows a schematic drawing of an optoelectronic device 1 of the invention. The device 1 is, in such case, bounded on the outside by a housing 10. The housing 10 is composed of a potting compound, in which the fuse mechanisms 11, 12, the optical transmitting unit and the optical receiving unit are embedded. The input electrical current circuit is electrically contactable via the contacts 51, 52. The optical transmitting unit in the form of a light-emitting diode 25 and the optical receiving unit in the form of a phototransistor 24 are arranged centrally in the housing 10. The output electrical current circuit 5 contains a phototransistor 24 and is electrically contactable via the contacts 61, 62. The light-emitting diode 25 transmits an optical signal to the phototransistor 24 lying opposite the light-emitting diode 25.

Within the housing 10 are provided electrical connecting lines, via which the optical transmitting unit, or the optical receiving unit, is electrically connected with the contacts 51, 52, or 61, 62. The input electrical current circuit 3 contains a first fuse mechanism in the form of a melting fuse 11, which, in the case of an overcurrent, interrupts the input electrical current circuit 3. The electrical current level, in the case of which the melting fuse 11 activates, is smaller than the electrical current level leading to an explosion of the optical transmitting unit. The melting fuse is, in such case, arranged in series in front of the optical transmitting unit.

If the input electrical current circuit 3 or the output electrical current circuit 5 of the optoelectronic device 1 is composed of a plurality of, possibly parallel, connecting lines, then the fuse mechanism 11, 12, is for example, so arranged, that it interrupts only the electrical current flow through the optoelectronic transmitting unit, or receiving unit, and thereby also ends the transmission of the optical signal of the optical transmitting unit to the optical receiving unit.

Between the phototransistor 24 and the contact 62 in the output electrical current circuit 5 is placed a second fuse mechanism, likewise in the form of a melting fuse 12. The second fuse mechanism is, in such case, designed analogously to the first fuse mechanism.

Instead of the phototransistor 24, also a photodiode can serve as optical receiving unit in this example of an embodiment.

Figure 3:
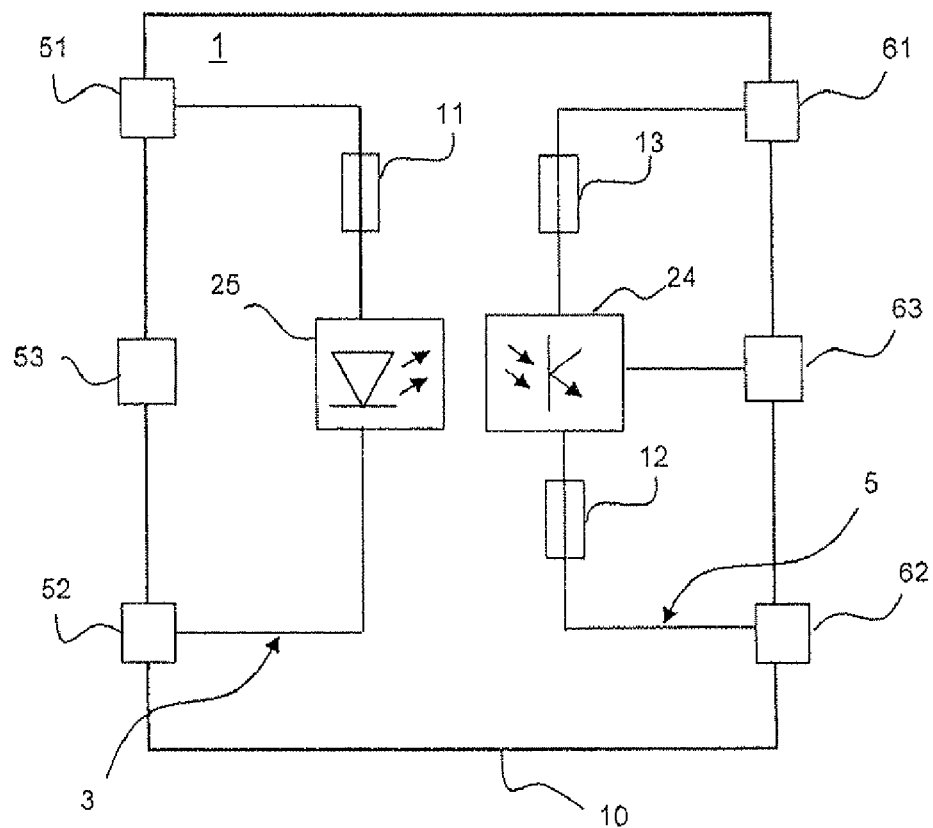
FIG. 3 is a schematic drawing of a second form of embodiment of an optoelectronic device of the invention.

FIG. 3 shows a second form of embodiment of the optoelectronic device 1 of the invention. In this example of an embodiment, the optical receiving unit is a phototransistor 24 with three electrical contacts 61, 62, 63. Contact 61 is connected with the collector connection and contact 62 with the emitter connection of the phototransistor. The base of the phototransistor 24 is connectable via the contact 63, in order to control (either open, or closed, loop control) the working point of the phototransistor 24. In order to secure the output electrical current circuit 5 against an overcurrent or an overvoltage, fuse mechanisms in the form of melting fuses 12, 13 are provided between the phototransistor 24 and the contacts 61, 62. The melting fuses 12, 13 have different triggering characteristics matched to the electrical current flow between the contact 61 and the collector-connection of the phototransistor 24 and the electrical current flow between the emitter-connection and the contact 62.

Contact 53 serves in the illustrated example of an embodiment only for additional anchoring of the optoelectronic device 1, for example, to an electronics board.

Figure 4:
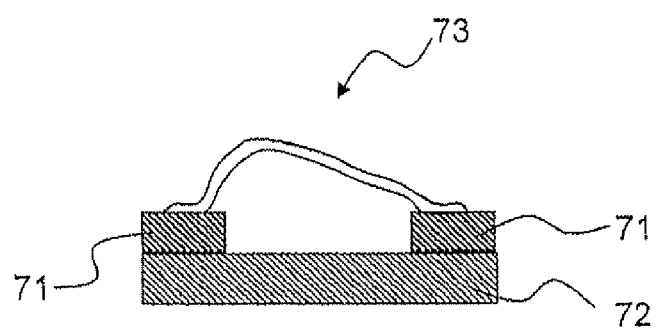
FIG. 4 is a schematic drawing of a wire connection between two electrical contacts.

FIG. 4 shows a wire connection ("wire bonding"). The wire connection 73 connects, in such case, two electrical contacts 71 with one another and is composed usually of gold, aluminum or copper. The diameter of the wire connection 73 can, in such case, lie between 15 μm and several hundred μm. Methods are already known in the state of the art for applying the wire connection 73, for example, by means of heat or ultrasound.

In order to assure melting of the wire connection 73 in the case of an electrical current flow with an electrical current level, which lies above a predetermined electrical current level, the wire gage and/or the material the wire connection 73 can be selected corresponding to the desired fuse characteristic.

Because of the small wire gages and the low melting point (about 660° C.) of the wire connecting material aluminum generally used in power electronics, a wire connection 73 can be especially advantageously embodied and used in this regard as a melting fuse.

The leading of the wire of the wire connection 73 is, in such case, so performed, that a melting of the wire is possible, without that a conductive channel of liquid metal forms.

As shown in FIG. 4, a cavity is located between the contacts 71, in order to accommodate the melted wire in the case of an overcurrent and, thus, to avoid an electrical contact via the melted material of the wire connection 73 between the contacts.

The contacts 71 can be, for example, selected ones of the contacts 51, 52, 53, 61, 62, 63 of the optoelectrical device 1. Additionally, there is the opportunity to combine the examples of embodiments illustrated in FIGS. 2, 3 and FIG. 4, in order to obtain an explosion resistant, optoelectronic device 1.

The invention claimed is:

1. An optoelectronic device for transmission of an electrical signal from an input electrical current circuit to an output electrical current circuit galvanically isolated from the input electrical current circuit, comprising:
   a housing;
   the input electrical current circuit contains, for producing an optical signal, an optical transmitting unit, which is arranged in said housing;
   the output electrical current circuit contains, for receiving the optical signal, an optical receiving unit, which is arranged in said housing;
   at least one fuse mechanism in said housing, which interrupts transmission of the electrical signal in the case of an electrical current flow, which lies above a predetermined electrical current level;
   at least two electrical terminals on said housing for establishing a first electrical connection with the input electrical current circuit; and
   at least two other electrical terminals on said housing for establishing a second electrical connection with the output electrical current circuit, wherein:
   said housing is composed at least partially of a potting compound; and
   said optical transmitting unit, said optical receiving unit and/or said fuse mechanism is embedded at least partially in the potting compound.

2. The optoelectronic device as claimed in claim 1, wherein:
   said fuse mechanism interrupts the input electrical current circuit or the output electrical current circuit in the case of an electrical current flow, which lies above a predetermined electrical current level.

3. The optoelectronic device as claimed in claim 1, wherein:
   said fuse mechanism is an electrical, electronic or thermal, fuse mechanism.

4. The optoelectronic device as claimed in claim 1, wherein:
   said fuse mechanism is so designed and so matched to said housing and/or the potting compound that, in the case of possible damage to said housing and/or the potting compound caused by activating of said fuse mechanism, said optical transmitting unit or said optical receiving unit remains at least partially surrounded by said housing and/or embedded in the potting compound.

5. The optoelectronic device as claimed in claim 1, wherein:
   said fuse mechanism has such a distance from said optical transmitting unit and/or from said optical receiving unit that, in the case of possible damage to said housing or the potting compound caused by activating of said fuse mechanism, said optical transmitting unit or said optical receiving unit said remains at least partially surrounded by said housing and/or embedded in the potting compound.

6. The optoelectronic device as claimed in claim 1, wherein:
   the input electrical current circuit contains at least a first fuse mechanism, which is arranged in said housing; and
   the output electrical current circuit contains at least a second fuse mechanism, which is arranged in said housing.

7. The optoelectronic device as claimed in claim 6, wherein:
   said first fuse mechanism is arranged in series with said optical transmitting unit; and/or
   said second fuse mechanism is arranged in series with said optical receiving unit.

8. The optoelectronic device as claimed in claim 6, wherein:
   said first fuse mechanism has a distance from said second fuse mechanism, which is greater than the distance of said optical transmitting unit from said optical receiving unit.

9. An optoelectronic device for transmission of an electrical signal of an input electrical current circuit to an output electrical current circuit galvanically isolated from the input electrical current circuit, wherein:
   the input electrical current circuit contains an optical transmitting unit for producing an optical signal; the output electrical current circuit contains an optical receiving unit for receiving the optical signal; wherein
   the input electrical current circuit and/or the output electrical current circuit is contactable via a wire connection;
   said wire connection is embodied as a fuse mechanism;
   and said wire connection is so designed, that it interrupts transmission of the electrical signal in the case of an electrical current flow, which lies above a predetermined electrical current level.

* * * * *